United States Patent [19]

Perkins

[11] Patent Number: 5,701,089
[45] Date of Patent: Dec. 23, 1997

[54] ALTERNATOR/STARTER TESTING DEVICE

[75] Inventor: Clifton G. Perkins, Memphis, Tenn.

[73] Assignee: Autozone, Inc., Memphis, Tenn.

[21] Appl. No.: 542,455

[22] Filed: Oct. 12, 1995

[51] Int. Cl.[6] ............................................. G01R 31/34
[52] U.S. Cl. ........................... 324/772; 324/545; 322/99
[58] Field of Search ............................... 324/537, 545, 324/555, 772, 402; 322/99

[56] References Cited

U.S. PATENT DOCUMENTS

| | | | |
|---|---|---|---|
| 3,629,704 | 12/1971 | Stevens | 324/98 |
| 3,745,456 | 7/1973 | Kahler | 324/378 |
| 3,893,029 | 7/1975 | Vensel et al. | 324/772 |
| 3,936,744 | 2/1976 | Perlmutter | 324/772 |
| 3,999,127 | 12/1976 | Siegl | 324/772 |
| 4,070,624 | 1/1978 | Taylor | 324/772 |
| 4,350,901 | 9/1982 | Kogawa et al. | 307/10.1 |
| 4,459,548 | 7/1984 | Lentz et al. | 324/772 |
| 4,490,620 | 12/1984 | Hansen | 290/38 R |
| 5,254,952 | 10/1993 | Salley et al. | 324/479 |
| 5,336,993 | 8/1994 | Thomas et al. | 324/772 |
| 5,550,485 | 8/1996 | Falk | 324/772 |

*Primary Examiner*—Glenn W. Brown
*Attorney, Agent, or Firm*—Banner & Witcoff, Ltd.

[57] ABSTRACT

An improved alternator/starter testing device includes an electronic voltage regulator for regulating the output of an externally regulated alternator. A selectable load switch allows so-called "high output" alternators to be tested without damaging the voltage regulator. For certain types of internally regulated alternators, the testing device includes a meter disconnect circuit, coupled to an "energize" switch in the testing device, which operates to disconnect the testing meter during a period in which the energize switch is temporarily depressed to supply power to an internally regulated alternator under test, thus preventing misleading test results if a defective alternator is tested. Internal thermal circuit breakers are provided at strategic locations in the testing device to prevent internal circuit damage due to defective alternators and starters. A delay off timer circuit disconnects power from a starter under test after a predetermined time period in order to prevent damage to the starter due to overtesting.

13 Claims, 6 Drawing Sheets

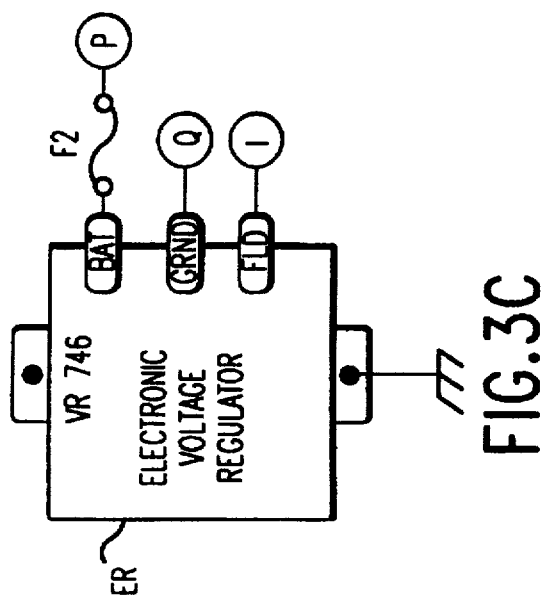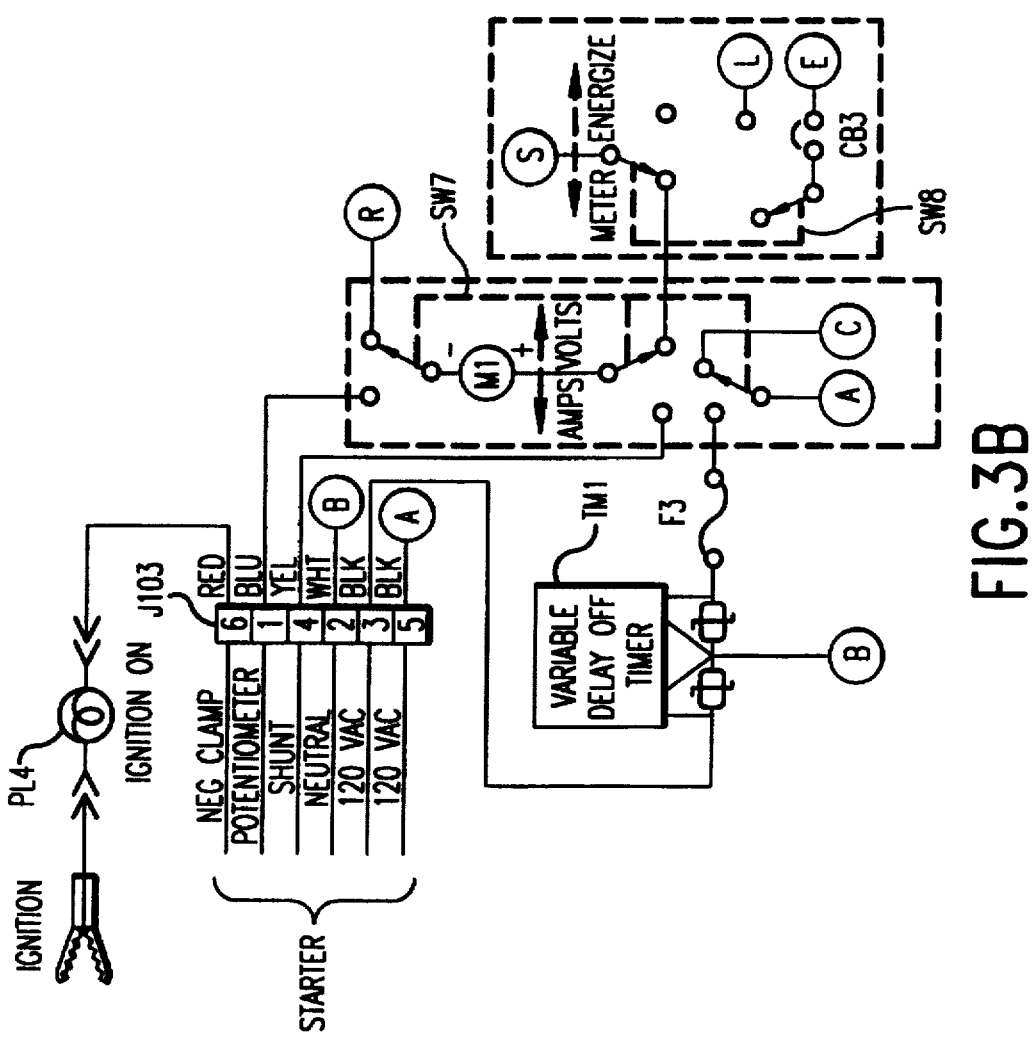

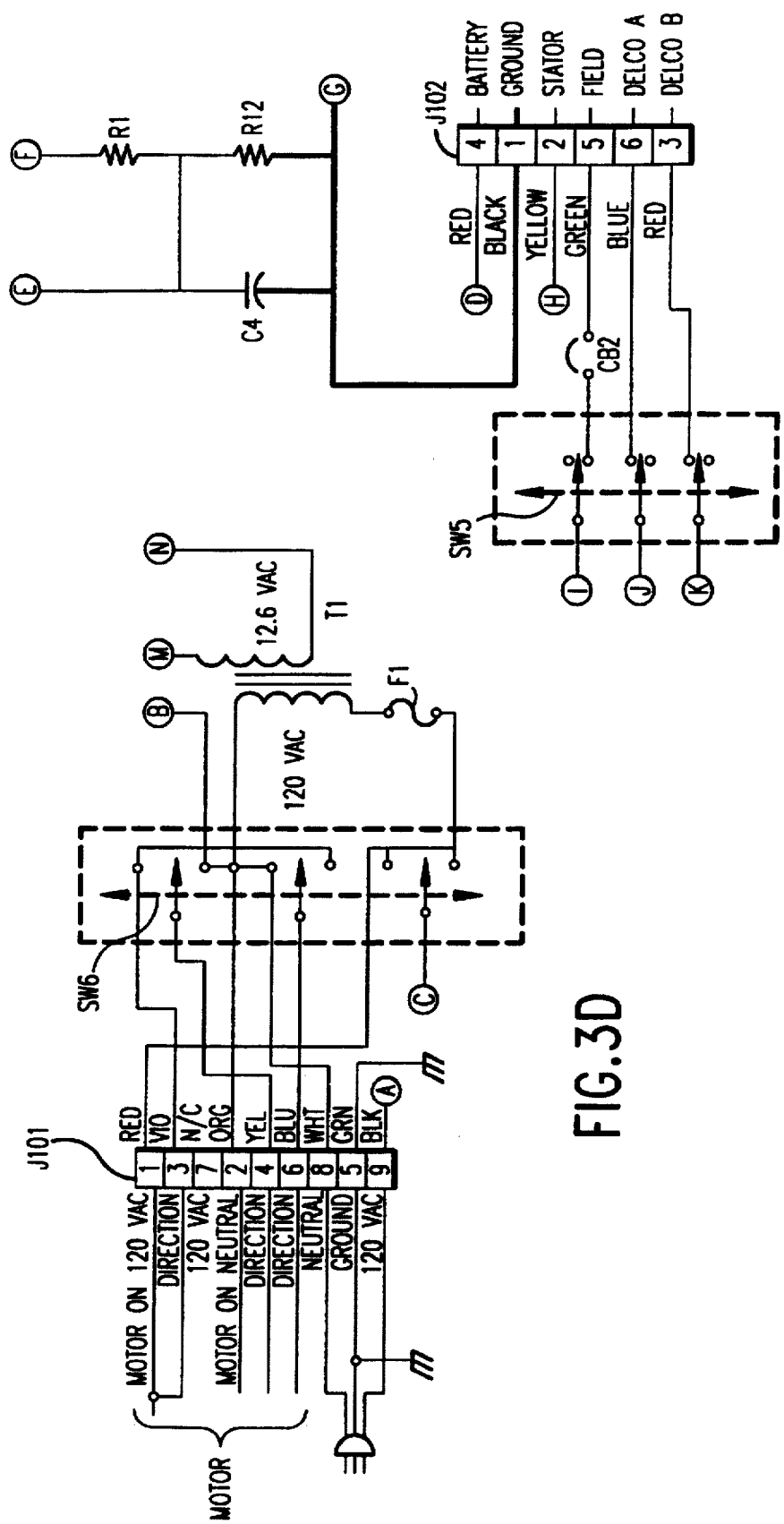

ALTERNATOR/STARTER TESTING DEVICE

BACKGROUND OF THE INVENTION

1. Technical Field

This invention relates generally to testing devices for automobile alternators and starters. In particular, the invention provides an improved testing device which overcomes problems of conventional testers.

2. Related Information

Conventional testing devices for automobile alternators and starters are well known. Such testers operate by mechanically connecting an alternator to a tester, turning on a motor which causes the alternator to rotate, and measuring on a meter the output voltage generated by the alternator under test. Starters are tested by electrically connecting a starter to the tester, providing power to the starter, and measuring the current flowing through the starter. Because the functions of testing alternators and starters are often combined into a single device, such testers are hereinafter referred to as "alternator/starter testers".

Many conventional alternator/starter testers suffer from problems such as unreliability, inaccurate or misleading test results, and damage caused to starters by overtesting. For example, conventional alternator/starter testers which employ mechanical voltage regulators to provide voltage regulation during an alternator test are easily damaged by repeated testing with defective alternators, necessitating frequent repairs. However, the use of electronic voltage regulators in such testing devices has heretofore been problematic or impossible.

As another example, conventional alternator/starter testers which provide an "energize" switch to apply voltage to the internal voltage regulator of certain alternators can cause misleading results to be displayed on a test meter when a defective alternator is tested. To avoid this problem, special instructions or training is necessary to inform operators of the testing devices to disregard the misleading meter reading during the "energize" period.

As yet another example, conventional alternator/starter testers fail to provide adequate internal circuit protection to prevent certain parts of the tester from being destroyed by defective alternators or starters.

As a final example, many starters may be damaged by overtesting. However, conventional testing devices do not prevent an inexperienced operator or customer from testing a starter for more than a few seconds, resulting in possible damage to the starter.

As a result of the above and other problems and disadvantages, conventional alternator/starter testers are unreliable, difficult to operate, and may provide misleading test results.

SUMMARY OF THE INVENTION

The present invention solves the aforementioned problems by providing an improved tester which includes, in various combinations, four improvement features. Each is summarized below.

Electronic Regulator for Externally Regulated Alternators

Alternators can be generally classified into two types: (1) those having an internal voltage regulator; and (2) those which require an external regulator in the automobile to regulate their output voltage. When testing the latter type of alternator, the tester itself must provide voltage regulation.

Conventional testing devices use a mechanical voltage regulator based on the same design as that used in many older automobiles. Such mechanical regulators are easily damaged by repeated testing with defective alternators. For example, the contact points wear out by overheating, resulting in eventual failure. Moreover, the output produced by such regulators leads to undesirable or inaccurate meter characteristics due to "needle jerks" caused by mechanical chatter in the regulator. However, it has heretofore been nearly impossible to use electronic voltage regulators because the polarity must sometimes be switched on the regulators (impossible with electronic regulators), and because older alternators require selectable 12 volt or 6 volt capability. Most newer alternators, however, do not require the 6 volt capability, nor do they require reversed polarity.

A first improvement comprises replacing the mechanical voltage regulator in the tester with an electronic 12 volt regulator. Additionally, a new switch is provided which accommodates so-called "high draw" alternators which draw 8 to 12 amps. If such an alternator is connected to the tester, this switch is manually toggled to reduce the voltage to the electronic regulator, which prevents it from being damaged.

Energize Switch Selectively Disengages Test Meter

Conventional testers include an "energize" switch which must be temporarily depressed to apply 12 volts to the battery posts of certain types of internally regulated alternators (specifically, "CS-type" alternators; such alternators only need to be "energized" for about 2 seconds until the internal regulator turns on). However, if this switch is pressed when a defective alternator is mounted on the tester, the test meter will incorrectly show favorable test results. Thus, an operator who erroneously holds this switch down and obtains a favorable meter reading (or who evaluates the meter while the switch is depressed) may be misled.

A second improvement thus involves coupling the energize switch to a meter disconnect circuit, so that when the energize switch is pressed, the meter is disconnected. When the energize switch is released, the meter will again be reconnected into the testing circuit, and it will provide a correct reading.

Internal Thermal Circuit Breakers

Conventional testers do not include protection to prevent certain parts of the tester from being destroyed by defective alternators or starters. For example, when the "energize" switch is pressed, supplying 12 volts to an alternator under test, a defective alternator can result in internal circuit overloads in the tester, possibly resulting in failure of the tester. Similarly, if an alternator under test contains shorted field windings, certain internal circuits can be damaged when the alternator is tested.

A third improvement involves inserting internal thermal circuit breakers in at least two circuit locations: one attached to the energize switch, to remove power from the switch if excessive current flows through the switch, and another in the circuit flowing through the alternator field windings. These circuit breakers are preferably internally mounted (rather than externally accessible).

Delay Off Timer

Many starters can be damaged by overtesting. Thus, for example, if a new starter is coupled to the tester and repeatedly spun under test, the starter itself can be damaged.

Conventional testers, however, allow an operator to test a starter as long as desired. Thus, there is no way to prevent inexperienced or inattentive operators from damaging a starter.

A fourth improvement involves the addition of a delay timer circuit which will only allow a fixed time period to elapse when testing a starter. After the fixed time period (e.g., three seconds), the power is disconnected to prevent the starter from spinning further.

Various other objects and advantages of the present invention will become apparent through the following detailed description, figures, and the appended claims.

BRIEF DESCRIPTION OF THE DRAWINGS

FIG. 3A to 3E show details of a circuit incorporating various principles of the invention.

DETAILED DESCRIPTION OF THE PREFERRED EMBODIMENTS

Figure 1:
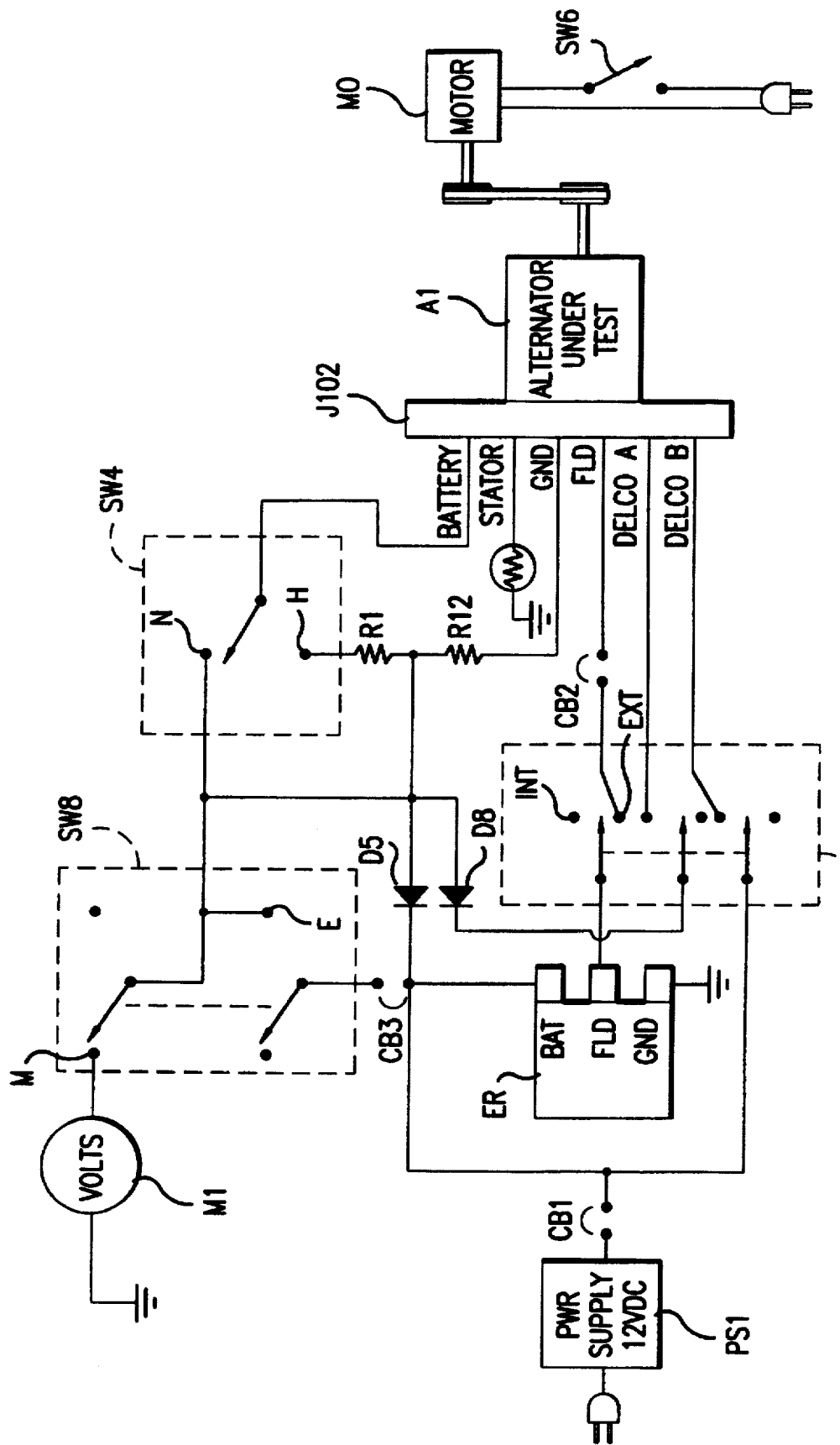
FIG. 1 shows in block diagram form various principles of the invention as applied to testing an alternator.

FIG. 1 shows in block diagram form an alternator testing circuit employing various principles of the present invention. Portions of the testing circuit which are not important to the inventive features have been generally omitted from the simplified circuit shown in FIG. 1.

As generally shown in FIG. 1, an alternator under test A1 is mechanically linked to a motor MO such as through a belt and pulley arrangement. The entire tester may be located in an automobile parts store and arranged in a console such that someone may place alternator A1 on the test console, couple the alternator to motor MO, and set various switches to conduct the test. In general, the alternator under test is electrically coupled to a jack J102 which allows various portions of the tester to make electrical contact with corresponding circuits inside the alternator under test. Depending on the type of alternator, jack J102 may include connectors for a battery line, a stator line, a ground line, a field line, a Delco A line, and a Delco B line. Other combinations and nomenclatures are of course possible.

In one embodiment, jack J102 couples to the battery, stator, ground, and field lines of an alternator under test; this arrangement is generally used for externally regulated alternators. For a "high output" alternator, a switch SW4 is set to a "high output" position H which causes the battery line to be connected to the ground line through series resistors R1 and R12. In this "high output" position, the voltage routed to the battery terminal BAT of electronic voltage regulator ER is also lowered by passing through resistor R1. Conversely, for "normal output" alternators, switch SW4 is moved to a "normal" position N which causes the battery line to be grounded only through resistor R12, and causes the full output voltage of the alternator to be connected to the battery pin BAT on regulator ER. A motor switch SW6 turns on the motor, which rotates the armature of alternator A1, causing it to generate a voltage at the battery terminal. The voltage generated by alternator A1 is passed through switch SW4, through diode D5, and is regulated by electronic regulator ER. The output voltage is displayed in volts on meter M1. It will be appreciated that meter M1 may comprise an analog meter, a digital meter, or other indicating means such as an array of LEDs or the like.

Switch SW5 is used to select between an internally regulated alternator and one which requires an external voltage regulator. Switch SW5 may comprise a ganged switch which, when moved into the "up" (INT) position, selects lines from jack J102 which are used for internally regulated alternators (i.e., it disconnects the field line and connects the Delco A and Delco B lines into the testing circuit), and when moved into the "down" (EXT) position, selects lines from jack J102 which are used for externally regulated alternators (i.e., it selects field line and disconnects the Delco A and Delco B lines). In summary, for externally regulated alternators (down position), the field line is connected to the field terminal of voltage regulator ER, which causes the voltage at the battery terminal on regulator ER to be regulated by alternately grounding and ungrounding at a high rate the field line of the alternator under test. Electronic voltage regulator ER may comprise any of various well known types, such as model VR 746 manufactured by Wells Manufacturing Co.

When in the INT position, switch SW5 connects the Delco A line of alternator A1 to the battery line of the alternator, and couples the Delco B line of alternator A1 to a power supply PS1 which simulates a car battery. This position, used for internally regulated alternators, supplies the internal regulator with battery power for operation. For certain internally regulated alternators, switch SW8 is used to temporarily supply the simulated battery voltage to the battery line of alternator A1 and simultaneously disconnect meter M1 from the testing circuit. Switch SW8 is thus preferably a temporarily depressed switch which is pressed for a few seconds to supply power to the alternator. In accordance with various principles of the invention, switch SW8 also disconnects meter M1 to prevent faulty meter readings during the energize period.

Figure 2:
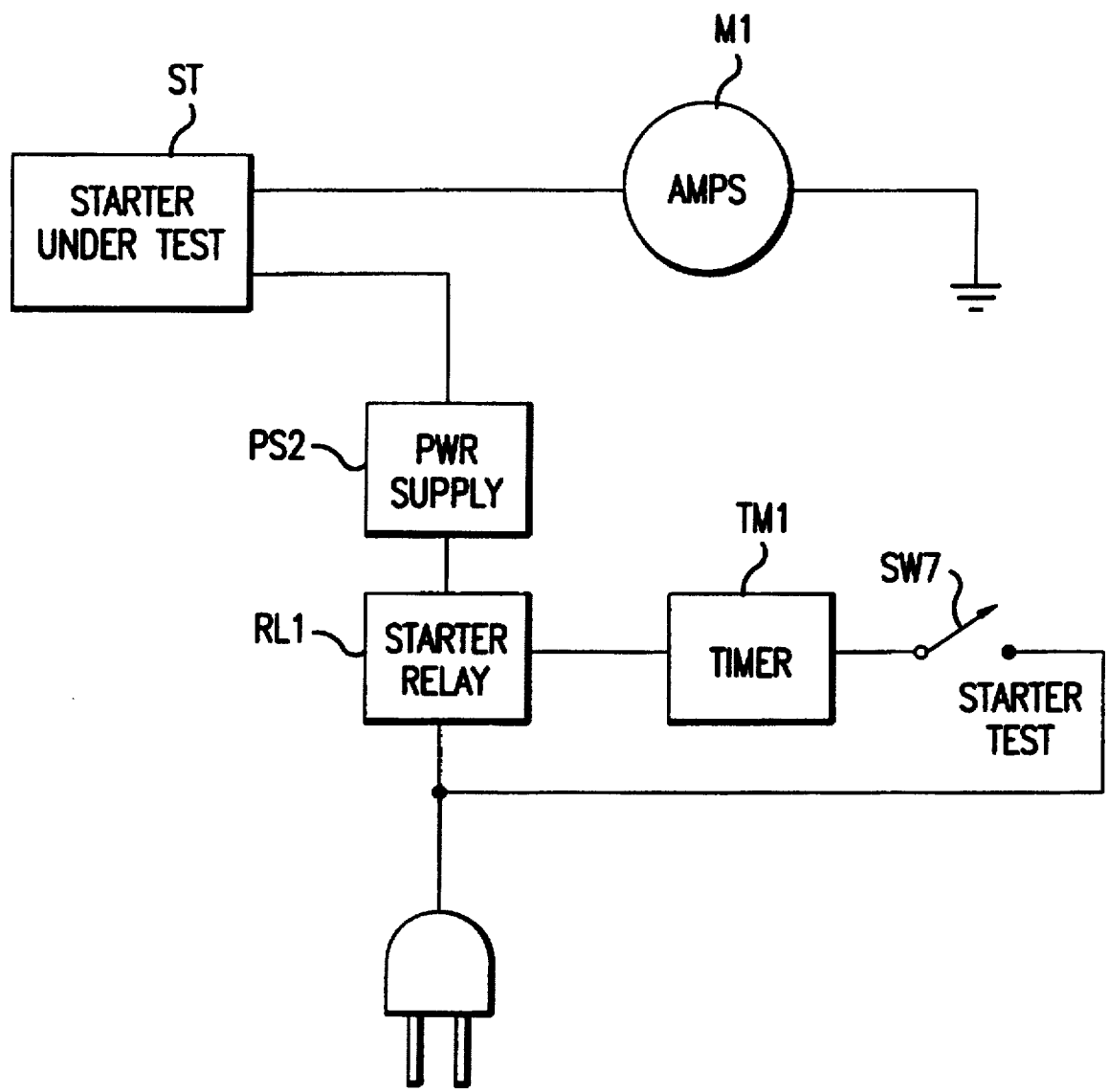
FIG. 2 shows in block diagram form various principles of the invention as applied to testing a starter.
Figure 3A:
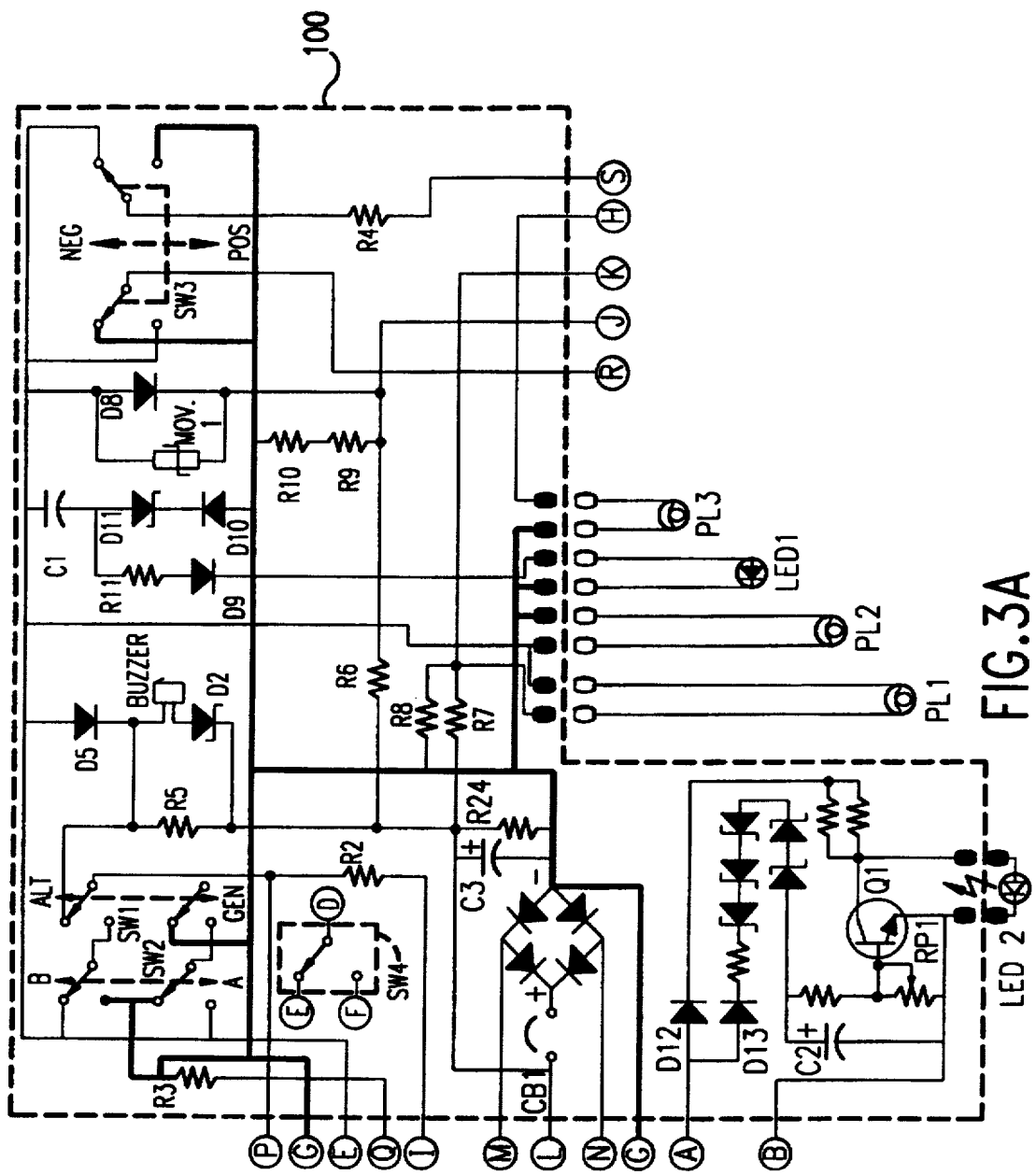

FIG. 2 shows in block diagram form a starter testing circuit employing various principles of the present invention. It will be understood that the circuit of FIG. 2 may be combined with that of FIG. 1 into a single alternator/starter testing device which may be used for in-store testing of alternators and starters which have been removed from automobiles. A starter under test ST is coupled to meter M1 (which may be the same meter as that in FIG. 1) to measure current flowing through the starter during a test. A starter power supply PS2 provides the voltage needed to turn starter ST. Starter relay RL1 couples the starter power supply to the starter under test in response to closing starter test switch SW7 (see bottom part of SW7 in FIG. 3). Timer TM1 is preferably coupled in series between the starter test switch SW9 and starter relay RL1. When an operator presses switch SW7, starter relay RL1 engages power supply PS2 to turn starter ST, and also activates timer TM1. After a predetermined time interval such as 2 or 3 seconds, timer TM1 disables starter relay RL1 despite the operator's holding down of switch SW7. This prevents overtesting of starter ST. Timer TM1 automatically resets for the next test.

FIG. 3A to 3E show additional details of a circuit employing various principles of the present invention. Identical letters enclosed in circles represent circuit portions which are connected together. For example, the field terminal FLD on electronic voltage regulator ER (FIG. 3C) is electrically connected to switch SW5 (FIG. 3E) as indicated by the use of the letter "I" enclosed in a circle at both locations. Bold circuit lines in FIG. 3A to 3E indicate grounded portions of the circuit. The operation of the circuit in FIG. 3A to 3E will now be described.

An alternator under test is coupled to jack J102 (FIG. 3E). For externally regulated alternators, the following lines and corresponding pins in jack J102 are generally used: battery (pin 4), ground (pin 1), stator (pin 2), and field (pin 5). For alternators which are internally regulated, the following lines and corresponding pins in jack J102 are generally used: battery (pin 4), ground (pin 1), Delco A (pin 6), and Delco B (pin 3).

The selection between internally regulated and externally regulated alternators is made via ganged switch SW5 (FIG. 3E), which, when switched into the "down" position, connects the field line into the testing circuit via internal thermal circuit breaker CB2 (hence coupling the field line of the alternator to field terminal FLD of electronic voltage regulator ER). Conversely, when switch SW5 is switched into the "up" position, the field line from the alternator is disconnected, but the Delco A line and Delco B line are connected into the testing circuit. In this latter position, the Delco B line is coupled to the output of the power supply via resistor R7 (note bridge rectifier output through internal polyswitch circuit breaker CB1), while the Delco A line is connected to the battery terminal of the alternator through diode D8.

Motor switch SW6 is used to activate a motor (not shown in FIG. 3) which turns the armature of the alternator under test. For an alternator test, switch SW7 (FIG. 3B) is assumed to be in the "volts" position for measuring the alternator output voltage. When switch SW7 is in the "volts" position, line R (negative side of meter) is grounded and line S (positive side of meter) is connected to the battery output D by way of resistor R4 to line E through switch SW4. This battery output, which is also coupled to battery terminal BAT of electronic regulator ER, is regulated by regulator ER through the action of field line I. Voltage regulator ER limits any excessive voltage at the battery terminal by opening the field line of the alternator under test, sampling at a high rate of speed (e.g., up to 7,000 times per second). The operator can read out the voltage generated by the alternator on meter M1. As indicated above, switch SW4 allows the tester to accommodate either high-output or normal alternators.

Switch SW4 (FIG. 3A) is set either to an "up", which connects the battery line of the alternator to the top of resistor R12 and subsequently to ground, or to a "down" position, which connects the battery line of the alternator to the top of resistor R1 and subsequently to ground line G (after flowing both through R1 and R12). For so-called "high output" alternators, switch SW4 is set to increase the load resistance on the alternator; for other alternator types, switch SW4 is set to produce a lower load resistance. As one example, resistor R1 may comprise a 1 ohm, 50 watt resistor, while resistor R12 may comprise a 3 ohm, 50 watt resistor. The load selection also helps protect electronic regulator ER from damage during testing with high-amperage alternators.

Switch SW8 (FIG. 3B) is an energize switch which, when momentarily depressed, connects the simulated battery voltage obtained at L to the battery line of the alternator under test by way of circuit point E and switch SW4. This energize function is used to supply voltage to the internal regulator of certain internally regulated alternators. Simultaneously, SW8 disconnects meter M1 from the circuit to prevent a faulty reading during the time period in which the energize circuit is enabled.

Conveniently, certain parts of the alternator/starter tester may be implemented on a circuit board 100 (FIG. 3A) which can be installed in or on a mechanical frame which includes couplings for the devices under test. Such an arrangement allows the circuit to be modified with minimal changes to the rest of the tester, for example. The lower portion of circuit board 100 includes a transistor circuit (including transistor Q1) which acts as a low-voltage detector. Generally speaking, if the AC voltage supplied to the tester falls below a suitable minimum, a low-voltage indicator LED2 is lit to indicate this condition. The operation of this type of circuit is conventional and well known.

When moved to the left (amps) position, switch SW7 (FIG. 3B) connects meter M1 into a current path of the starter under test, and connects power supply line A to delay off timer TM1. Zener varistors may be used to shunt power spikes to ground.

Figure 4:
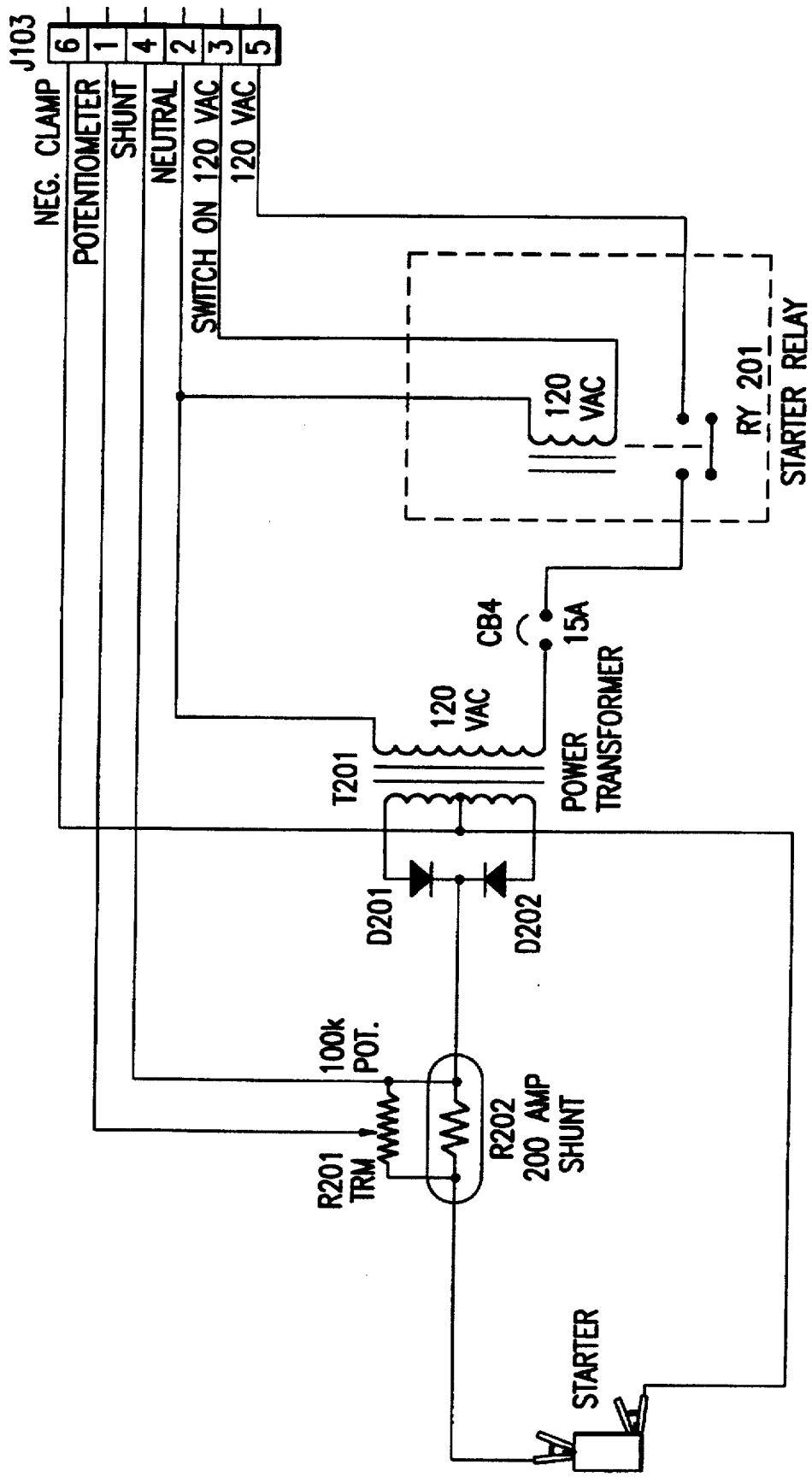
FIG. 4 shows details of how a starter testing circuit may be coupled to the circuit of FIG. 3B.

FIG. 4 shows additional details for connecting a starter test circuit to the circuit shown in FIG. 3A to 3E. The figure is self-descriptive and no further elaboration is necessary.

It is apparent that many modifications and variations of the present invention are possible, and references to specific values are by example only. It is, therefore, to be understood that within the scope of the appended claims the invention may be practiced otherwise than as specifically described.

I claim:

1. A device for testing an alternator which has been removed from an automobile, comprising:

a motor adapted to be temporarily coupled to the alternator for rotating an armature of the alternator as part of a test;

a test coupling jack, adapted to be electrically connected to a corresponding connector on the alternator, the test coupling jack comprising a battery line connector, a ground line connector, and a field line connector, each line connector for connecting to a corresponding circuit in the alternator;

a power supply for simulating an automobile battery voltage, an output thereof coupled to the battery line connector;

a voltage regulator having a first terminal coupled to the power supply and to the battery line connector, and a second terminal coupled to the field line connector, wherein the voltage regulator regulates a voltage present at the first terminal by controlling a voltage at the second terminal;

a meter coupled to the battery line connector for displaying a voltage generated by the alternator in response to the test; and a meter disconnect switch, coupled to the meter and to the power supply, for disconnecting the meter when the power supply is connected to the battery line of the alternator.

2. The device of claim 1, further comprising a "high draw alternator" switch, coupled to the battery line connector, for selectively connecting the battery line connector either to a first resistive load which produces a first voltage drop with respect to the first terminal of the voltage regulator, or to a second resistive load which produces a second voltage drop with respect to the first terminal of the voltage regulator.

3. The device of claim 1, further comprising an internal thermal circuit breaker, connected in series with the field line connector, for disconnecting the field line connector from the voltage regulator in response to an excessive current flowing therethrough, and for re-connecting the field line connector to the voltage regulator when a temperature thereof falls below a threshold.

4. The device of claim 1,
   wherein the test coupling jack further comprises a Delco A line connector and a Delco B line connector, each for connecting to a corresponding circuit in the alternator, the device further comprising an internal/external switch, coupled to the Delco A line connector, the Delco B line connector, and the field line connector, the internal/external switch for selecting between a first position in which the field line connector is disconnected from the voltage regulator and the Delco A and Delco B line connectors are connected into a testing circuit, and a second position in which the field line connector is connected to the second terminal of the voltage regulator and the Delco A and Delco B line connectors are disconnected from the testing circuit.

5. The device of claim 4, wherein in the first position the Delco A line is connected to the battery line connector and the Delco B line is connected to the power supply.

6. The device of claim 1, further comprising:
   a starter power supply for supplying a starting voltage to a starter under test;
   a starter relay for connecting the starter power supply to the starter;
   a starter test switch for activating the starter relay; and
   a timer, coupled to the starter relay and to the starter test switch, for disabling the starter relay after a predetermined time interval;
   wherein the meter displays a current flowing through the starter instead of an alternator voltage.

7. The apparatus of claim 1, wherein the voltage regulator comprises an electronic voltage regulator.

8. The device of claim 1, further comprising an internal thermal circuit breaker, coupled between the meter disconnect switch and the battery line connector, for disconnecting the battery line connector in response to an excessive current therethrough, and for re-connecting the battery line connector when a temperature thereof falls below a threshold.

9. A device for testing an alternator which has been removed from an automobile, comprising:
   a motor adapted to be temporarily coupled to the alternator for rotating an armature of the alternator as part of a test;
   a test coupling jack, adapted to be electrically connected to a corresponding connector on the alternator, the test coupling jack comprising a battery line connector and a ground line connector, each line connector for connecting to a corresponding circuit in the alternator;
   a power supply for simulating an automobile battery voltage, an output thereof coupled to the battery line connector;
   a meter coupled to the battery line connector for displaying a voltage generated by the alternator in response to the test; and
   a switch, coupled to the meter and to the power supply, for temporarily connecting the power supply to the battery line connector and simultaneously disconnecting the meter from the battery line connector.

10. A device for testing an alternator which has been removed from an automobile, comprising:
    a motor adapted to be temporarily coupled to the alternator for rotating an armature of the alternator as part of a test;
    a test coupling jack, adapted to be electrically connected to a corresponding connector on the alternator, the test coupling jack comprising connectors for coupling to an "internal" type alternator having an internal voltage regulator and to an "external" type alternator which relies on external voltage regulation;
    a power supply for simulating an automobile battery voltage, an output thereof coupled to the test coupling jack;
    an electronic voltage regulator which provides external voltage regulation for "external" type alternators;
    a meter which displays a voltage generated by the alternator in response to the test;
    an internal/external switch, coupled to the electronic voltage regulator and the test coupling jack, the internal/external switch providing a first circuit path which connects the electronic voltage regulator into a testing circuit for "external" type alternators and a second circuit path which disconnects the electronic voltage regulator from the testing circuit for "internal" type alternators; and
    a "high draw alternator" switch, coupled to the test coupling jack and the electronic voltage regulator, which provides a first circuit path causing a first voltage drop to be presented to the electronic voltage regulator and a second circuit path causing a greater voltage drop to be presented to the electronic voltage regulator.

11. The testing device of claim 10, further comprising a meter disconnect switch, coupled to the meter and to the power supply, which disconnects the meter when the power supply is connected to the test coupling jack.

12. The testing device of claim 10, further comprising a thermal circuit breaker coupled between the test coupling jack and the meter, wherein the thermal circuit breaker disconnects the alternator from the meter in response to an excessive current flowing therethrough.

13. The testing device of claim 10, further comprising:
    a starter power supply for supplying a starting voltage to a starter under test;
    a starter relay for connecting the starter power supply to the starter;
    a starter test switch for activating the starter relay; and
    a timer, coupled to the starter relay, which disables the starter relay after a predetermined time interval.

* * * * *